(12) United States Patent
Hong et al.

(10) Patent No.: US 7,799,130 B2
(45) Date of Patent: Sep. 21, 2010

(54) SILICON SINGLE CRYSTAL INGOT AND WAFER, GROWING APPARATUS AND METHOD THEREOF

(75) Inventors: Young Ho Hong, Gumi-si (KR); Man Seok Kwak, Daejeon (KR); Ill-Soo Choi, Gumi-si (KR); Hyon-Jong Cho, Gumi-si (KR); Hong Woo Lee, Gumi-si (KR)

(73) Assignee: Siltron, Inc., Gumi-Si (KR)

( * ) Notice: Subject to any disclaimer, the term of this patent is extended or adjusted under 35 U.S.C. 154(b) by 968 days.

(21) Appl. No.: 11/460,408

(22) Filed: Jul. 27, 2006

(65) Prior Publication Data
US 2007/0022943 A1 Feb. 1, 2007

(30) Foreign Application Priority Data
Jul. 27, 2005 (KR) ........................ 10-2005-0068482
Nov. 15, 2005 (KR) ........................ 10-2005-0109305

(51) Int. Cl.
C30B 15/00 (2006.01)
(52) U.S. Cl. ............................ 117/30; 117/11; 117/13; 117/20; 117/32; 117/917; 117/931
(58) Field of Classification Search .................... 117/11, 117/13, 20, 30, 32, 917, 931
See application file for complete search history.

(56) References Cited

U.S. PATENT DOCUMENTS 5,178,720 A * 1/1993 Frederick ...................... 117/20
6,113,688 A * 9/2000 Kawanishi et al. ............ 117/30
7,291,221 B2 * 11/2007 Korb ............................ 117/30
7,559,988 B2 * 7/2009 Cho .............................. 117/30
2002/0157600 A1 * 10/2002 Fusegawa et al. ............. 117/30
2004/0129201 A1 * 7/2004 Cho et al. ..................... 117/13
2007/0119365 A1 * 5/2007 Harada et al. ................ 117/13
2007/0227442 A1 * 10/2007 Lu .............................. 117/208
2008/0038179 A1 * 2/2008 Fukatsu et al. ............. 423/348
2008/0107582 A1 * 5/2008 Hong et al. ................. 423/263
2009/0183670 A1 * 7/2009 Cho et al. ..................... 117/32

FOREIGN PATENT DOCUMENTS
JP 2001-089289 3/2001
KR 1020020011956 A 12/2001

* cited by examiner

Primary Examiner—Robert M Kunemund
Assistant Examiner—Matthew J Song
(74) Attorney, Agent, or Firm—Miller, Matthias & Hull

(57) ABSTRACT

A silicon single crystal ingot growing apparatus for growing a silicon single crystal ingot based on a Czochralski method The silicon single crystal ingot growing apparatus includes a chamber; a crucible provided in the chamber, and for containing a silicon melt; a heater provided at the outside of the crucible and for heating the silicon melt; a pulling unit for ascending a silicon single crystal grown from the silicon melt; and a plurality of magnetic members provided at the outside of the chamber and for asymmetrically applying a magnetic field to the silicon melt Such a structure can uniformly controls an oxygen concentration at a rear portion of a silicon single crystal ingot using asymmetric upper/lower magnetic fields without replacing a hot zone In addition, such a structure can controls a flower phenomenon generated on the growth of the single crystal by the asymmetric magnetic fields without a loss such as the additional hot zone (H/Z) replacement, P/S down, and SR variance.

13 Claims, 10 Drawing Sheets

Figure 1:
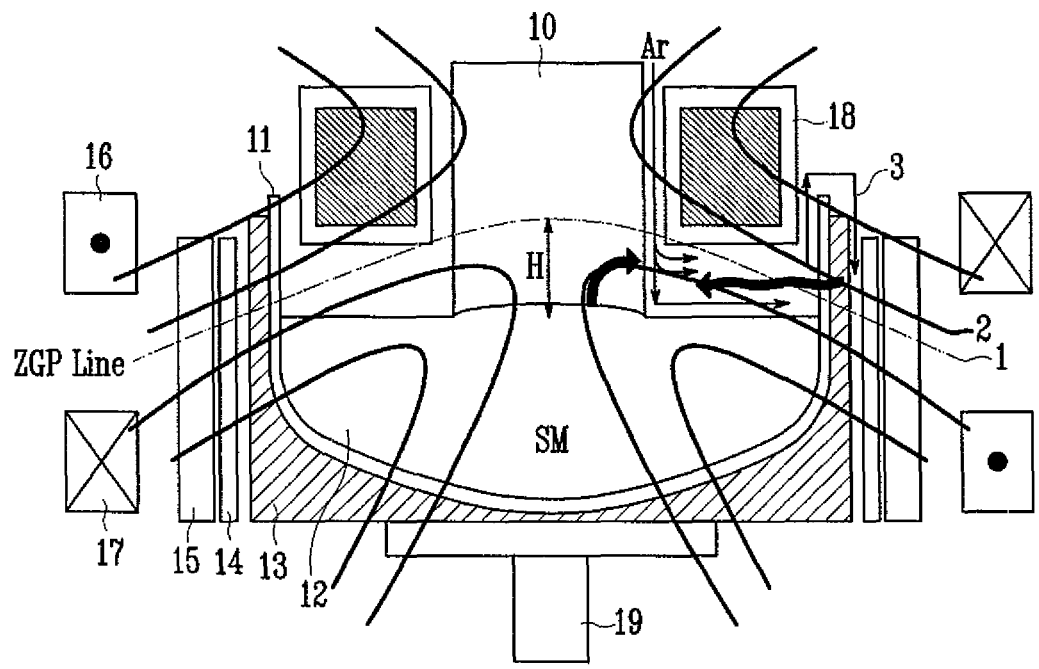

Ratio 1
4.467e⁻² m/s

Ratio 1.36
4.436e⁻² m/s

Ratio 2
4.370e$^{-2}$ m/s

Ratio 4.09
4.279e$^{-2}$ m/s

Ratio 1

Ratio 1.36

SILICON SINGLE CRYSTAL INGOT AND WAFER, GROWING APPARATUS AND METHOD THEREOF

CROSS-REFERENCE TO RELATED APPLICATION

This application claims priority to and the benefit of Korean Patent Applications Nos. 10-2005-0068482 and 10-2005-0109305 filed in the Korean Intellectual Property Office on Jul. 27 and Nov. 15, 2005, the entire contents of which are incorporated herein by reference.

BACKGROUND OF THE INVENTION (a) Field of the Invention

The present invention relates to a silicon single crystal ingot and wafer, a growing apparatus and method thereof. More particularly, the present invention relates to a silicon single crystal ingot growing apparatus and method for controlling a flower phenomenon due to an abnormal process, and providing various oxygen concentrations corresponding to client's requirements (appropriate for semiconductor devices) uniformly in a longitudinal or radial direction, when the silicon single crystal ingot is grown based on a Czochralski method.

(b) Description of the Related Art

Generally, when the silicon single crystal ingot is grown based on a Czochralski method, it is necessary to uses a Si crucible for containing a silicon melt Such a silica crucible elutes oxygen, and the eluted oxygen reacts with the silicon melt and solutes in the same thereby being transited into SiOx As a result, the eluted oxygen is mixed into a single crystal Accordingly, it allows the single crystal to have a bulk micro defect (BMD) so that a wafer has an increased strength by the BMD acting as a gettering site with respect to a metal impurity in semiconductor manufacturing processes. However, it induces various defects and segregations thereby deteriorating a yield thereof on a production of a semiconductor device However, the oxygen concentration according to a longitudinal direction of the ingot is increased due to Oi(Interstitial Oxygen) pumping phenomenon, particularly, at a rear portion of the ingot. In addition, a rotation of the crucible along with a rotation of a seed (SR) induces a flower phenomenon (denoted because a surface of the crystal ingot look like a flower), which forms a radial cross section of the single crystal not as a circular shape, but as an indented shape. Regarding the flower phenomenon, yet, precise mechanism has not been discovered However, there are various theories related to the melt convection. In order to control such a crystal oxygen concentration and a flower phenomenon, the crucible and ingot rotation speed, ingot pulling speed, and the like have been controlled or a cooling heat history have been controlled by adjusting a heating area through a change of a hot zone (H/Z) design such as a length of a heater and physical properties of an insulating member. However, theses methods have problems in that they require a long time and involve a large cost for changing the H/Z design each time, and they also need a lot of time to establish new conditions because the ingot's quality such as oxygen concentration is changed according to the change of the H/Z. In addition, the most powerful method for controlling the flower phenomenon may include decreasing a pulling speed (hereinafter, referred to as P/S) and improving the rotation speed ratio of the seed and crucible However, theses methods also have a problem in that the productivity is deteriorated and a quality for satisfying such recent wafer quality requirements as a low defect density is not satisfied. The above information disclosed in this Background section is only for enhancement of understanding of the background of the invention and therefore it may contain information that does not form the prior art that is already known in this country to a person of ordinary skill in the art

SUMMARY OF THE INVENTION

The present invention has been made in an effort to provide a silicon single crystal ingot and wafer, a growing apparatus and method thereof having advantages of uniformly controlling an oxygen concentration of a silicon single crystal ingot using asymmetric upper/lower magnetic fields without replacing a hot zone.

The present invention has been made in an effort to provide a silicon single crystal ingot and wafer, a growing apparatus and method thereof having advantages of controlling an oxygen concentration along to a longitudinal direction or radial direction of the single crystal ingot thereby increasing productivity regardless of the single crystal length according to the diameter and charging sizes thereof The present invention has been made in an effort to provide a silicon single crystal ingot and wafer, a growing apparatus and method thereof having advantages of controlling a flower phenomenon generated on the growth of the single crystal by the asymmetric upper/lower magnetic fields without a loss such as the additional hot zone (H/Z) replacement, P/S down, and SR variance The present invention has been made in an effort to provide a silicon single crystal ingot and wafer, a growing apparatus and method thereof having advantages of having a large diameter greater than 200 mm without having a under diameter along to a radial direction thereof.

The present invention has been made in an effort to provide a silicon single crystal ingot and wafer, a growing apparatus and method thereof having advantages of having a high productivity and quality An exemplary embodiment of the present invention provides a silicon single crystal ingot growing apparatus for growing a silicon single crystal ingot based on a Czochralski method the silicon single crystal ingot growing apparatus includes a chamber; a crucible provided in the chamber, and for containing a silicon melt; a heater provided at the outside of the crucible and for heating the silicon melt; a pulling unit for ascending a silicon single crystal grown from the silicon melt; and a plurality of magnetic members provided at the outside of the chamber and for asymmetrically applying a magnetic field to the silicon melt.

Another exemplary embodiment of the present invention provides a silicon single crystal ingot growing method for growing a silicon single crystal ingot based on a Czochralski method. The silicon single crystal ingot growing method includes asymmetrically applying a magnetic field to an outside of a silicon single crystal ingot growing apparatus using a cusp type magnetic member; and pulling a single crystal ingot from a crystal melt surface.

The magnetic field may include upper/lower magnetic fields applied by upper/lower coil members disposed at an outside of the silicon single crystal ingot, the upper/lower magnetic fields respectively having an intensity controlled by at least one of a current applied to at least one of the upper/lower coil members and an induction member.

BRIEFNESS OF DESCRIPTION OF THE DRAWINGS

Figure 2:
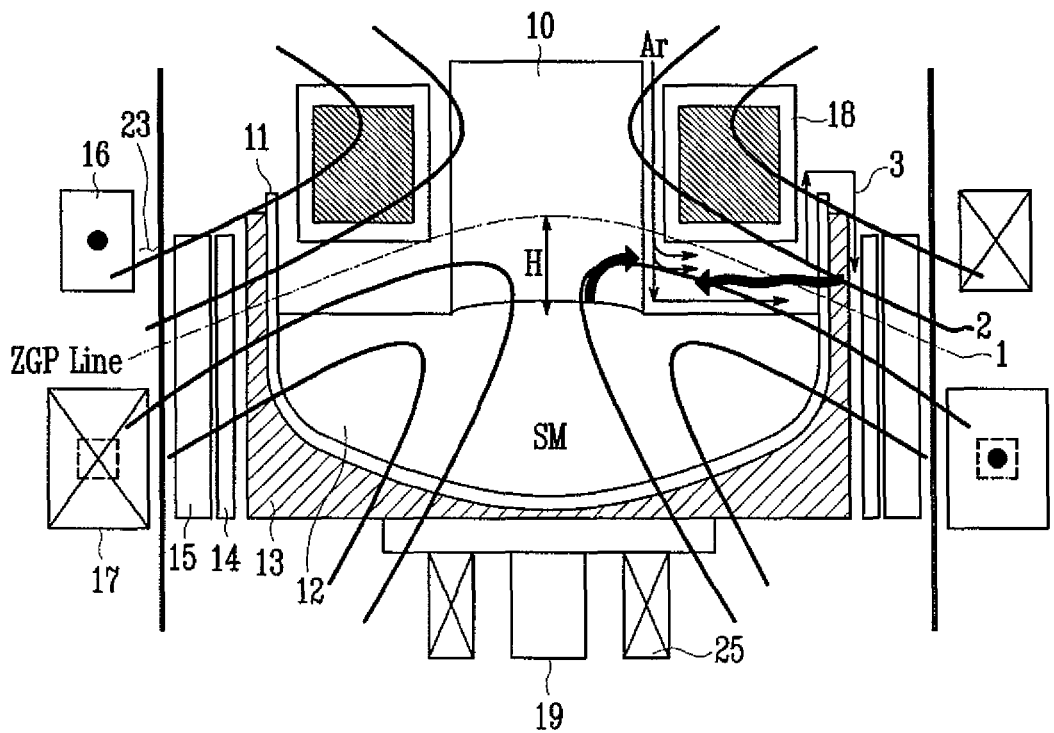
Figure 3:
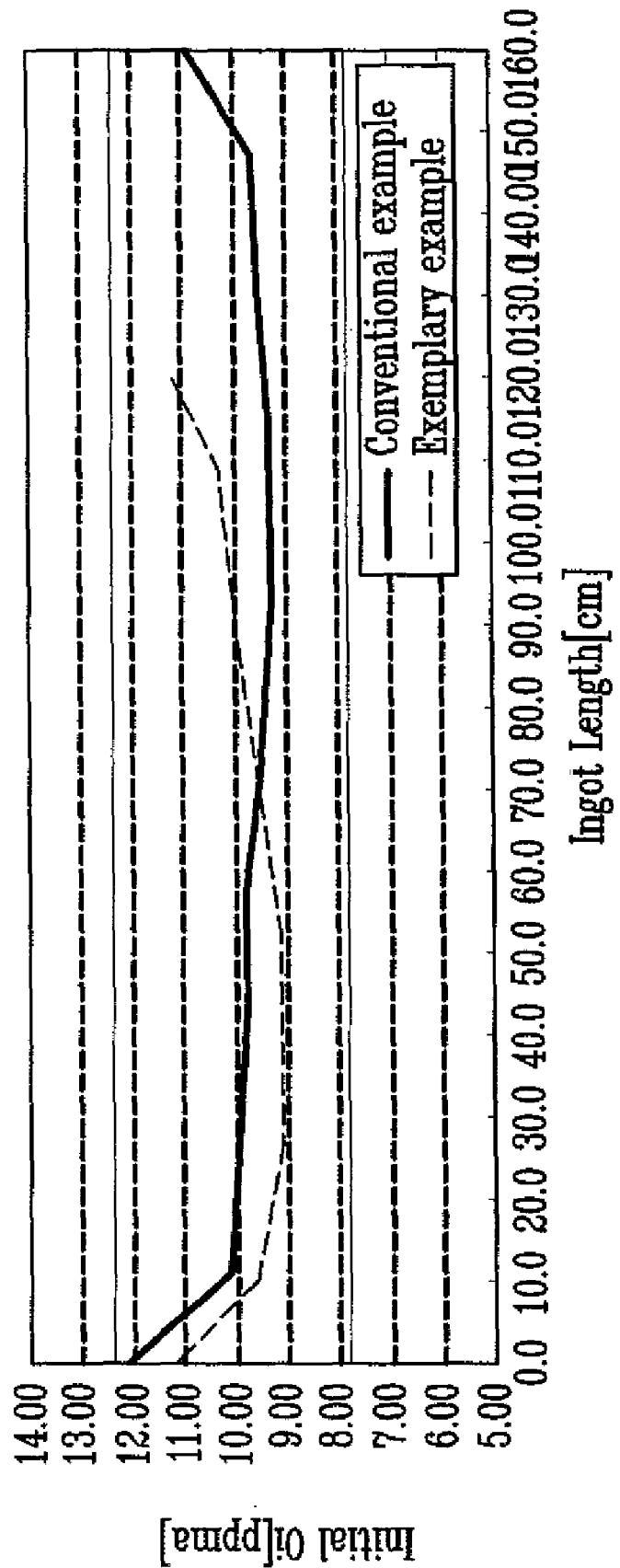
Figure 4:
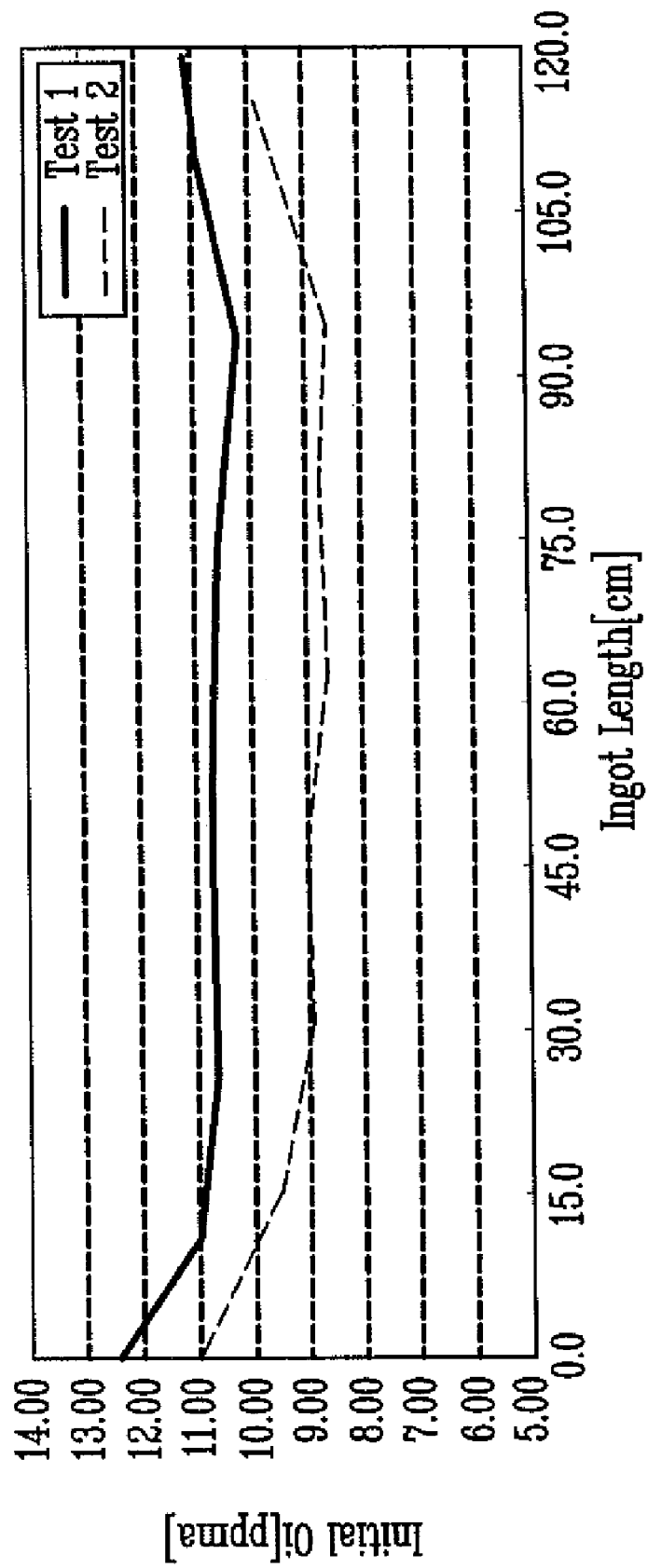

FIG. 1 schematically illustrates a silicon single crystal growing apparatus according to an exemplary embodiment of the present invention FIG. 2 schematically illustrates a silicon growing apparatus according to another exemplary embodiment of the present invention FIG. 3 is a graph for comparing a uniformity of an oxygen concentration along to a longitudinal direction of a silicon single crystal ingot according to an exemplary embodiment of the present invention to that according to a conventional embodiment FIG. 4 is a graph for showing an oxygen concentration profile controlled by a silicon single crystal growing method according to an exemplary embodiment of the present invention.

Figure 5:
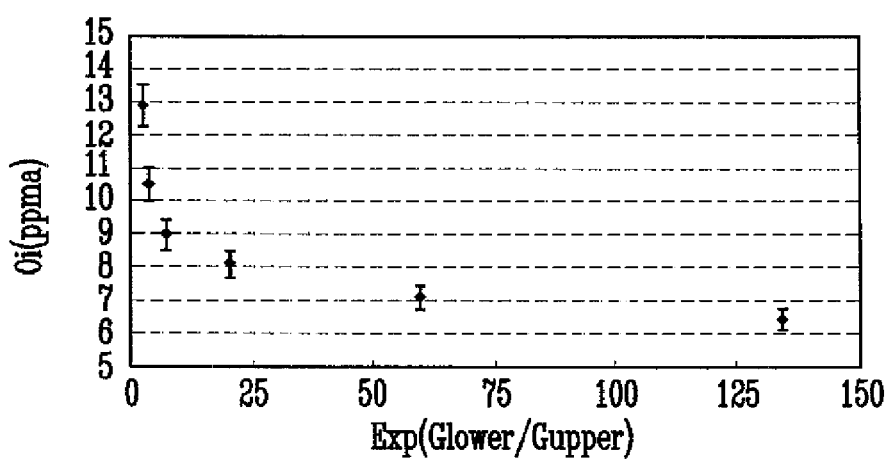
Figure 6:
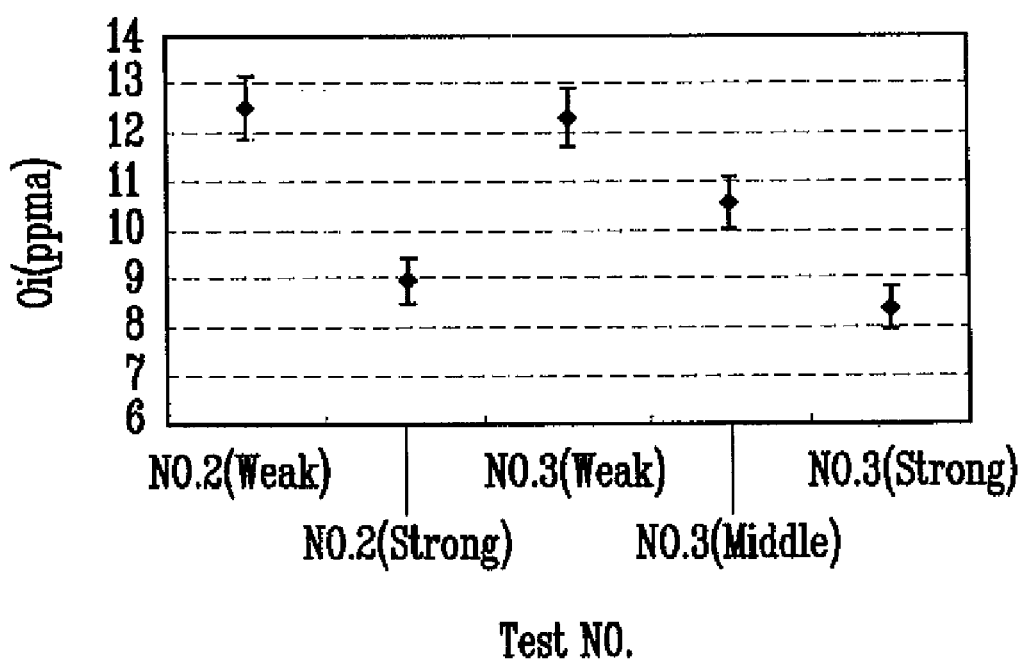
Figure 9:
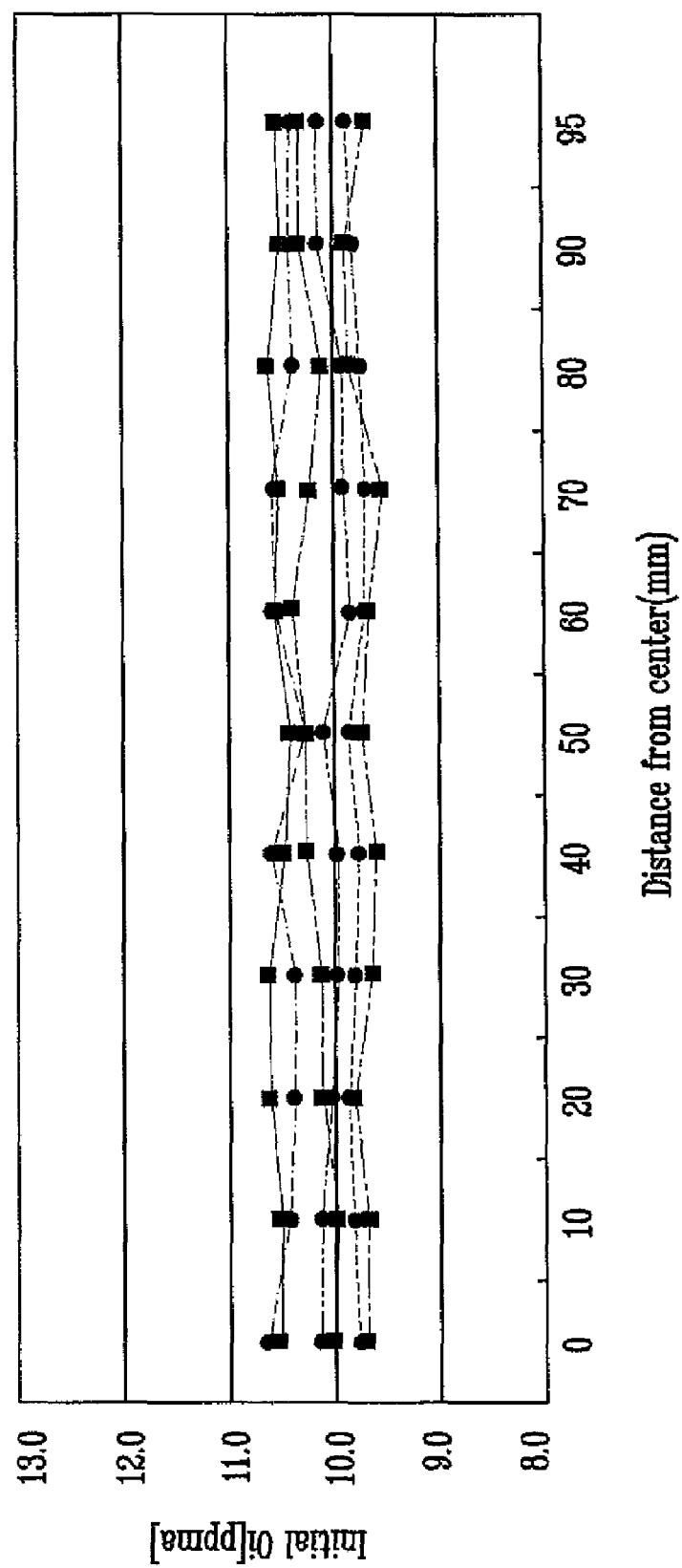

FIG. 5 is a graph and a table of oxygen concentration qualities obtained by changing a ratio of asymmetry upper/lower magnetic fields according to an exemplary embodiment of the present invention FIG. 6 is a graph and a table of oxygen concentration qualities obtained by changing an intensity of a magnetic field while the ratio of the asymmetric upper/lower magnetic fields are maintained according to an exemplary embodiment of the present invention FIG. 7A to FIG. 7D show a simulation result of ratios of the asymmetric upper/lower magnetic fields used for the silicon single crystal growing method according to an exemplary embodiment of the present invention FIG. 8A to FIG. 8D show a variance of a SR center used for the silicon single crystal growing method according to an exemplary embodiment of the present invention FIG. 9 is a graph showing an oxygen concentration along to a radial direction of a wafer manufactured by a silicon single crystal growing method according to an exemplary embodiment of the present invention.

DETAILED DESCRIPTION OF THE EMBODIMENTS

An exemplary embodiment of the present invention will hereinafter be described in detail with reference to the accompanying drawings First, a silicon single crystal growing apparatus according to an exemplary embodiment of the present invention will be described.

FIG. 1 schematically illustrates a silicon single crystal growing apparatus according to an exemplary embodiment of the present invention Referring to FIG. 1, a silicon single crystal growing apparatus for growing a single crystal ingot based on Czochralski method includes a chamber (not shown), which performs a growth of a single crystal ingot 10 therein In addition, the chamber is provided with a crucible 11 made of quartz and containing a silicon melt SM 12 therein The crucible 11 is surrounded by a supporting member 13 so as to support the same.

The supporting member 13 is fixed on a rotating shaft 19. When the rotating shaft 19 is rotated by a driving source (not shown), the crucible 11 is rotated and is ascended such that a solid-liquid interface is maintained at the same plane The supporting member 13 is also surrounded by a cylindrical heater 14 at a predetermined distance, and the heater 14 is surrounded by an insulating member 15.

The heater 14 heats a very pure poly-silicon mass accumulated in the crucible 11 to form the silicon melt 12, and the insulating member 15 prevents the heat from being diffused exterior to the chamber thereby improving heat efficiency.

In addition, an pulling mean (not shown) for growing an ingot is provided on a upper portion of the crucible 11, the puling mean has a cable connected to a seed at the lower portion thereof, and the seed is in contact with the silicon melt 12 in the crucible 11 and is grown into the crystal ingot 10. The pulling mean is rotated by being wound up the cable on the growth of the single crystal ingot 10. At this time, the silicon single crystal ingot 10 is rotated in an opposite direction to a rotation direction of the crucible.

In addition, so as to smoothly grow the silicon single crystal ingot 10, such inert gases as argon Ar, neon Ne, and nitrogen N are injected into the upper portion of the chamber, and the used inert gases are ejected through the lower portion of the chamber In FIG. 1, the reference number 3 indicates the inert gas, that is, Ar flowing sate in which being injected into the upper portion of the chamber, and ejected through the lower portion of the chamber so as to smoothly grow the silicon single crystal ingot 10.

A thermal insulator or thermal shield 18 is provided between the silicon single crystal ingot 10 and the crucible 11 such that it surrounds the ingot 10 The thermal shield 18 has been developed to reduce a temperature gradient in a crystal radial direction because the silicon wafers having uniform in-plane quality have been requested. The terminal shield 18 acts to adjust a cooling speed of an exterior circumferential portion of the ingot 10 by isolating a thermal radiated from the ingot 10.

The thermal shield 18 may be made from graphite coated with molybdenum Mo, tungsten W, carbon C or SiC and formed in various shapes. Accordingly, the thermal shield 18 may have other structures excluding the structure of FIG. 1

According to an exemplary embodiment of the present invention, on the growth of the single crystal ingot based on Czochralski method, a magnetic field is applied to the silicon melt 12 contained in the crucible 11. Accordingly, magnetic members 16 and 17 are provided to adjust the magnetic field. At this time, the magnetic members 16 and 17 have different structures for asymmetrically applying upper/lower magnetic fields along to an axis direction of the chamber.

In more detail, the magnetic members may include an upper coil member 16 and a lower coil member 17 at a lower portion thereof, which have a circular solenoid structure for surrounding the chamber The upper/lower coil members 16 and 17 form a magnetic field indicated by the reference number 2 of FIG. 1

Referring to FIG. 1, it may be known that the magnetic field formed by the upper/lower coil members 16 and 17 is asymmetric, and a Zero Gauss Plane (ZGP) thereof is placed at an upper portion of the silicon melt.

By such a asymmetric upper/lower fields, the melt convection of in the quartz crucible 11 related to the oxygen elution and the movement of the eluted oxygen may be controlled. That is, the melt convection and the thermal flow may be remarkably suppressed in a direction vertical to a flux of the magnetic field and moved in a direction parallel to the same by means of the asymmetric upper/lower magnetic fields, when the ZGP may be placed at the upper portion of the silicon melt or the lower magnetic field may be stronger than the upper magnetic field.

According to an exemplary embodiment of the present invention, the upper/lower coil members 16 and 17 may have the same radius based on the rotating shaft of the crucible 19 and have a solenoid structure wound by the same number of coils.

Accordingly, the magnetic fields may be provided only to the chamber, and have different intensities depending on a current applied to the respective upper/lower coil members 16 and 17.

At this time, it is preferable that the lower coil member 17 is connected to a power supply having a higher voltage than that of the higher coil member 16 so as to apply a high current to the lower coil member 17 It is because that the lower coil member 17 have a larger effect on the melt convection It is preferable that Voltages $V_1$ and $V_2$ connected to the upper/lower coil members 16 and 17 may satisfies $1.00 \leq Exp(V_2/V_1) \leq 135.00$.

On satisfying such condition, a silicon single crystal ingot having various oxygen concentrations corresponding to the client's requirements may be produced.

In addition, the current may not be differently applied to the upper/lower coil members 16 and 17, but magnetic induction members 23 and 25 may be provided, which is able to move at a constant acceleration in a direction vertical to the magnetic flux direction and current direction Particularly, the lower coil member 17 may have an iron core therein, such that the lower magnetic field becomes stronger In FIG. 1, (⊙, ⊗) indicates a current direction According to an exemplary embodiment of the present invention, such parameters (for example, the ratio of voltages) may be determined such that the ZGP and the silicon melt surface satisfies $0 \leq ZGP\_center-silicon$ melt surface $\geq 500$, assumed that a upper is given as (+) and a lower is given as (-) based on a upper of the heater 14 when ZGP(Zero Gauss Plane) of the magnetic field applied by the upper/lower coil member 16 and 17 and the silicon melt surface correspond with the upper of the heater In addition, the parameters may be determined such that the ratio of the upper/lower magnetic fields satisfies $1.00 \leq Exp(G\_lower/G\_upper) \leq 135.00$ when the measured intensity of the lower magnetic field is given as G_lower and the measured intensity of the upper magnetic field is given as G_upper, and the ZGP satisfies $Y=C_1-C_2X-C_3X^2$, $C_1 \leq 500$ and $1 \leq Exp(C_3/C_2) \leq 25$ along to a radial direction of the silicon single crystal growing apparatus (herein, Y is a position of ZGP, X is a radial-direction position in the crucible, and, $C_1$, $C_2$, and $C_3$ are coefficients when the ratio of the upper/lower magnetic fields is applied)

Now, a crystal growing apparatus according to another exemplary embodiment of the present invention will be described with reference to FIG. 2.

FIG. 2 schematically illustrates a silicon growing apparatus according to another exemplary embodiment of the present invention, in which includes other constituent elements excluding the magnetic members of FIG. 1. Accordingly, the same constituent elements as theses of FIG. 1 may not be described for briefness of description.

Referring to FIG. 2, the magnetic members may include additional magnetic members 25 disposed at a lower portion of the chamber, excluding the magnetic members of FIG. 1, or a plurality of coil members may be continuously provided according to a longitudinal direction (in Z direction) of the chamber at the exterior portion thereof, and accordingly, the number of the upper/lower coil members may be selectively determined depending on the ratio of the upper/lower magnetic fields by changing an amount and direction of the current applied thereto For example, the upper coil member may use two coil members having one current direction and the lower coil member may use three coil members having opposite current direction thereof In addition, so as to asymmetrically apply upper/lower magnetic fields along to an axis direction of the chamber, the upper/lower coil members 16 and 17 may have different coil wound directions each other (for example, clockwise direction and counterclockwise direction), the lower coil member 17 has the greater diameter than that of the upper coil member 16 while the same number of coils are wound thereon.

In addition, the upper/lower coil members 16 and 17 may have different wound directions (clockwise direction and counterclockwise direction), and have the same diameter while the different number of coils are respectively wound thereon.

According to another exemplary embodiment of the present invention, it is preferable that the upper/lower coil members have different diameters $D_1$ and $D_2$ satisfying $1.00 \leq Exp(D_1/D_2) \leq 135.00$, and different coil wound numbers $N_1$ and $N_2$ satisfying $1.00 \leq Exp(N_2/N_1) \leq 135.00$ According to another exemplary embodiment of the present invention, such parameters (for example, the ratio of voltages) may be determined such that the ZGP and the silicon melt surface satisfies $0 \leq ZGP\_center-silicon$ melt surface $\leq 500$, assumed that a upper is given as (+) and a lower is given as (-) based on a upper of the heater 14 when ZGP(Zero Gauss Plane) of the magnetic field applied by the upper/lower coil member 16 and 17 and the silicon melt surface correspond with the upper of the heater.

In addition, the parameters may be determined such that the ratio of the upper/lower magnetic fields satisfies $1.00 \leq Exp(G\_lower/G\_upper) \leq 135.00$, when the measured intensity of the lower magnetic field is given as G_lower and the measured intensity of the upper magnetic field is given as G_upper, and the ZGP satisfies $Y=C_1-C_2X-C_3X^2$, $C_1 \leq 500$ and $1 \leq Exp(C_3/C_2) \leq 25$ along to a radial direction of the silicon single crystal growing apparatus (herein, Y is a position of ZGP, X is a radial-direction position in the crucible, and, $C_1$, $C_2$, and $C_3$ are coefficients when the ratio of the upper/lower magnetic fields is applied)

Hereinafter, it is described that such parameters are able to be determined such that the silicon wafers have uniform in-plane quality and have various oxygen concentration qualities corresponding to the client's requirement by controlling the ratio of the magnetic fields without additionally changing the hot zone (H/Z) or the parameters, and simultaneously, a ingot growth speed may be improved thereby expending an good ingot growing length expending and improving a productivity.

A FIRST EXPERIMENTAL EXAMPLE

First, on the growth of 8-inch silicon single crystal ingot based on the Czochralski method using the silicon single crystal growing apparatus of FIG. 1, an amount of inflow of Ar gas was about 60 lpm to 70 lpm(liter per min) and a pressure thereof was about 25 to 50 torr, the rotation speed of the silicon single crystal seed was more than about 13 rpm, preferably, 16 to 17 rpm, and the rotation speed of the quartz crucible was less than 7 rpm, preferably, 1.5 rpm (rotation per min), most preferably 0.5 rpm to 0.7 rpm, and the pulling speed of the silicon single crystal ingot was more than 0.5 to 0.7 rpm, most preferably, 0.64 to 0.69 mm/min At this time, according to a conventional example, the single crystal ingot may be grown without the application of the magnetic field On the other hand, according to an exemplary embodiment of the present invention, the single crystal ingot was grown, for example, while the upper/lower coil member 16 and 17 respectively is applied with voltages 100V and 200V, that is, the single crystal ingot was grown while the asymmetric upper/lower magnetic field are applied thereto In addition, when the upper/lower coil member 16 and 17 have different intensities, the ZGP (Zero Gauss Plane) may be disposed on the upper portion of the silicon melt 12 based on the ZGP center-position 'H' as shown in FIG. 1 In this embodiment, it is one example that the ZGP may be disposed on the upper portion of the silicon melt 12 based on the ZGP center-position 'H' However, the present invention may not be limited thereto.

Through the conventional example and the experimental example, results of FIG. 3 may be obtained.

FIG. 3 is a graph for comparing a uniformity of an oxygen concentration along to a longitudinal direction of a silicon single crystal ingot according to an exemplary embodiment of the present invention to that according to a conventional embodiment.

In FIG. 3, according to the conventional example, on the growth of the Si ingot, it can be known that the ingot has a decreased uniformity of the oxygen concentration along to a longitudinal direction thereof due to Interstitial Oxygen(Oi) pumping phenomenon, particularly, in a rear portion of the ingot body, in comparison with the schematic upper/lower limits (shown in a slight solid line) of the desired oxygen concentration (about 10.50 ppma (parts per million atoms))

On the other hand, according to an exemplary embodiment of the present invention, it can be known that the ingot has a uniform oxygen concentration from the front of the body to the rear thereof.

It will be described that the desired various oxygen concentrations may be obtained by changing the ratio of the asymmetry magnetic field

SECOND EXPERIMENTAL EXAMPLE

FIG. 4 is a graph for showing an oxygen concentration profile controlled by a silicon single crystal growing method according to an exemplary embodiment of the present invention First, on the growth of the 8-inch silicon single crystal ingot based on the Czochralski method using the silicon single crystal growing apparatus of FIG. 1, an amount of inflow of Ar gas was about 60 lpm to 70 lpm(liter per min) and a pressure of the same was about 25 to 50 torr, the rotation speed of the silicon single crystal seed was more than about 13 rpm(rotation per min), preferably, 16 to 17 rpm, and the rotation speed of the quartz crucible was less than about 7 rpm, preferably, 1.5 rpm (rotation per min), most preferably 0.5 rpm to 0.7 rpm, and the pulling speed of the silicon single crystal ingot was more than 0.5 to 0.7 rpm, most preferably, about 0.64 to 0.69 mm/min.

At this time, as shown in FIG. 4, in Test 1 and Test 2, the ratio of the currents applied to the respective upper/lower coil members 16 and 17 is changed, and accordingly, the ratio of the upper/lower magnetic fields is changed According to an exemplary embodiment of the present invention, it can be known that silicon single crystals having different oxygen concentrations may be grown by changing the ratio or intensity of the upper/lower magnetic fields Hereinafter, a preferable range of the ratio of the upper/lower magnetic fields for having a uniform oxygen concentration in a longitudinal direction of ingot and providing an oxygen concentration corresponding to the client's requirements will be described with reference to experimental examples in which the ratio or intensity of the upper/lower magnetic fields is changed.

THIRD EXPERIMENTAL EXAMPLE

FIG. 5 is a graph and a table of oxygen concentration qualities obtained by changing a ratio of asymmetry upper/lower magnetic fields according to an exemplary embodiment of the present invention In this experimental embodiment, on the growth of the 8-inch silicon single crystal ingot based on the Czochralski method using the silicon single crystal growing apparatus of FIG. 1, an amount of inflow of Ar gas was about 60 lpm to 70 lpm(liter per min), a pressure thereof was about 25 to 50 torr, the rotation speed of the silicon single crystal seed was more than about 13 rpm, preferably, 16 to 17 rpm, the rotation speed of the quartz crucible was less than 7 rpm, preferably, 1.5 rpm (rotation per min), most preferably 0.5 rpm to 0.7 rpm, and the pulling speed of the silicon single crystal ingot was more than 0.5 to 0.7 rpm, most preferably, 0.64 to 0.69 mm/min.

In samples 1, 2, 3, 4, 5 and 6 of FIG. 5, when the upper/lower magnetic members are asymmetrically applied with currents on the actual growth of the silicon single crystal, the ratios of the upper/lower magnetic fields are determined as 2.718, 3.896, 7.389.20.491, 59.740 and 134.290.

At this time, the oxygen concentrations corresponding to the ratios are respectively given as 12.900, 10.500, 9.000, 8.100, 7.090 and 6.453

It can be known that the oxygen concentration qualities are deteriorated according to an increase of the ratio of the asymmetric upper/lower magnetic fields as described above. It is because the concentration of the oxygen eluted into the melt is changed according to a change of the magnetic field component applied to the inner wall of the quartz crucible 11.

FOURTH EXEMPLARY EMBODIMENT

FIG. 6 is a graph and a table of oxygen concentration qualities obtained by changing an intensity of a magnetic field while the ratio of the asymmetric upper/lower magnetic fields are maintained according to an exemplary embodiment of the present invention First, on the growth of the 8-inch silicon single crystal ingot based on the Czochralski method using the silicon single crystal growing apparatus of FIG. 1, an amount of inflow of Ar gas was about 60 lpm to 70 lpm(liter per min), a pressure thereof was about 25 to 50 torr, the rotation speed of the silicon single crystal seed was more than about 13 rpm, preferably, 16 to 17 rpm, and the rotation speed of the quart crucible was less than 7 rpm, preferably, 1.5 rpm (rotation per min), most preferably 0.5 rpm to 0.7 rpm, and the pulling speed of the silicon single crystal ingot was more than 0.5 to 0.7 rpm, most preferably, 0.64 to 0.69 mm/min As shown in FIG. 6, in case of NO.2 having a magnetic field ratio 2, it can be known that the single crystal ingots respectively having an oxygen concentration of about 12.549 and 8.961 are obtained by changing the intensity of the magnetic field from for example 250 G to 500 G.

In addition, in case of NO.3 having a magnetic field ratio 3, it can be known that the single crystal ingots respectively having an oxygen concentration of about 12.35, 10.57, and 8.392 are obtained by changing the same such that the intensity of the magnetic fields has 250 G, 350 G, and 500 G.

That is to say, in case that the same ratio of the upper/lower magnetic fields is applied, the oxygen concentration qualities may be controlled by the intensity of the magnetic field. That is, a higher oxygen concentration may be realized by a weaker magnetic field in case of the same ratio of the upper/lower magnetic fields In addition, although the ratio of the magnetic fields may be different as NO2 and NO3, the oxygen concentration qualities may be controlled by properly adjusting the intensity of the magnetic fields As a result, according to an exemplary embodiment of the present invention, when the measured intensity of the lower magnetic field is given as G_lower and the measured intensity of the upper magnetic field is given as G_upper, the ratio of the upper/lower magnetic fields satisfies Equation 1 as follows.

$$1.00 \leq Exp(G\_lower/G\_upper) \leq 135.00 \quad \text{(Equation 1)}$$

According to FIG. 5, the Equation 1 may be changed as follows $$2.718 \leq Exp(G\_lower/G\_upper) \leq 134.29$$

Herein, the asymmetry of the upper/lower magnetic fields is increased as the ratio of the upper/lower magnetic fields has been increased Accordingly, when the arrangements of the coil members 16 and 17 are not physically changed, but the power source connected to the coil members 16 and 17 is changed, and accordingly, the ratio of the magnetic fields are changed, the ZGP center 'H' may be ascended to the upper of the silicon melt 12 corresponding to an increase of the asymmetry of the magnetic fields as shown in FIG. 1, and accordingly, a lower oxygen concentration may be realized.

Assumed that a upper is given as (+) and a lower is given as (−) based on a upper of the heater 14 when ZGP (Zero Gauss Plane) of the magnetic field applied by the upper/lower coil member 16 and 17 and the silicon melt surface correspond with the upper of the heater, the relation between the ZGP and the silicon melt surface satisfies Equation 2 as follows $$0 \leq ZGP\_center - silicon\ melt\ surface \leq 500 \quad \text{(Equation 2)}$$

Equation 2 indicates that the ZGP should be placed at least on the surface of the silicon melt 12, that is, on the upper thereof As described above, the invention prevent may not be limited thereto, only if the oxygen concentration is determined according to the position of ZGP The ZGP of the upper/lower magnetic fields applied satisfying the Equation 1, 2 follows Equation 3, when it is measured along to a radial direction of an inside of the crystal grower $$Y = C_1 - C_2 X - C_3 X^2 \quad \text{(Equation 3)}$$

In Equation 3, Y is a position of ZGP, X is a radial-direction position in the crucible, and, $C_1$, $C_2$, and $C_3$ are coefficients when the ratio of the upper/lower magnetic fields is applied.

Equation 3 is deduced as a regression equation using a statistic tool based on the experimental data As shown in Equation 3, it is expressed into a quadratic equation, and the magnetic field may be formed in a parabola format In Equation 3 obtained from an application of Equations 1 and 2, the coefficient C may satisfy Equations 4 and 5 as follow by physically changing the ratio of the upper/lower magnetic fields $$C_1 \leq 500 \quad \text{(Equation 4)}$$

In Equation 4, $C_1$ indicates an intercept value of Equation 3, in which it indicates the ZGP center position 'H', and finally indicates that the ZGP center position 'H' is placed less than the maximum 500 mm relating to Equation 2

$$1 \leq Exp(C_3/C_2) \leq 25 \quad \text{(Equation 5)}$$

Equation 5 indicates a relation of the coefficients $C_2$ and $C_3$ relating to Equation 3, which implies that the asymmetry may be increased as he values thereof are increased.

That is, looking at Equation 3 based on Equations 4 and 5, it can be known that it is preferable that the ZGP center position 'H' as the intercept value $C_1$ is placed less than the maximum 500 mm and a ratio of the ZGP position relative to a radial direction of the inside of the crucible 11 is within a range of 1 to 25.

As a result, theses Equations imply that the desired oxygen concentration can be controlled when the asymmetry of the upper/lower magnetic fields follows the same, the ZGP is placed above the surface of the silicon melt 12, and the parameter may be applied within the above-noted ranges.

According to an exemplary embodiment of the present invention, it is one example that 8-inch silicon single crystal ingot is grown. Accordingly, various-diameter silicon single crystal ingots may be grown In addition, it can be known that only if any one condition of Equations 1 to 5 is satisfied on the actual production of the silicon single crystal ingot, the oxygen concentration qualities can be controlled by means of adjusting the intensity of the magnetic field According to an exemplary embodiment of the present invention, the respective oxygen concentration qualities corresponding to the client's oxygen concentration requirements as well as a lower oxygen concentration of less than the oxygen concentration 10.5 ppma can be provided by adjusting a magnetic field ratio or intensity within a range of Equations 1 to 5 without changing additional hot zones H/Z as shown in FIG. 6.

According to an exemplary embodiment of the present invention, the respective oxygen concentration qualities corresponding to the clients oxygen concentration requirements can be adjusted, the single crystal growth having a uniform quality in a longitudinal direction thereof can be achieved without a loss due to the changing of the additional hot zones (H/Z), particularly, a prime length is maximized by suppressing an oxygen concentration pumping at a rear portion thereof, and accordingly, a productivity improvement may be expected Now, it is described with reference to FIG. 7A to 7d and FIG. 7A to 8d that a silicon single crystal ingot growing method according to an exemplary embodiment of the present invention can control a flower phenomenon generated on the growth of the silicon single crystal ingot FIG. 7A to FIG. 7D show a simulation result of ratios of the asymmetric upper/lower magnetic fields used for the silicon single crystal growing method according to an exemplary embodiment of the present invention; FIG. 8A to FIG. 8D show a variance of a SR center used for the silicon single crystal growing method according to an exemplary embodiment of the present invention.

First, on the growth of the 8-inch silicon single crystal ingot based on the Czochralski method using the silicon single crystal growing apparatus of FIG. 1, an amount of inflow of Ar gas was about 60 lpm to 70 lpm(liter per min), a pressure thereof was about 25 to 50 torr, the rotation speed of the silicon single crystal seed was more than about 13 rpm, preferably, 16 to 17 rpm, the rotation speed of the quartz crucible was less than 7 rpm, preferably, 1.5 rpm (rotation per min), most preferably 0.5 rpm to 0.7 rpm, and the pulling speed of the silicon single crystal ingot was more than 0.5 to 0.7 rpm, most preferably, 0.64 to 0.69 mm/min.

When the ratio of the upper/lower magnetic fields is increased from 1.0 to 4.9 by changing the voltages applied to the upper/lower coil members 16 and 17 provided at the exterior portion of the chamber, the melt convection is simulated as shown in FIG. 7A to FIG. 7D.

Figure 7A:
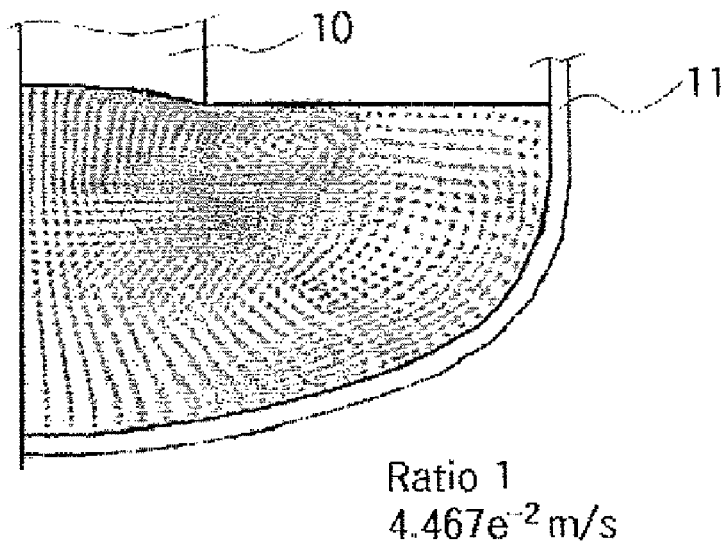
Figure 7B:
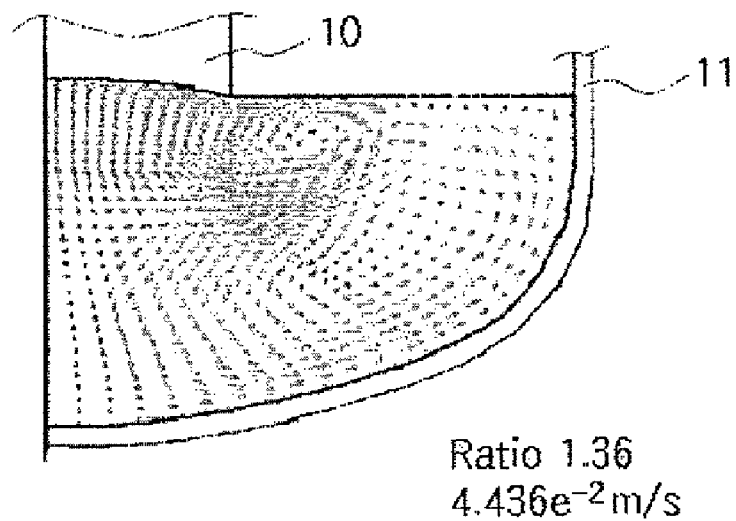
Figure 7C:
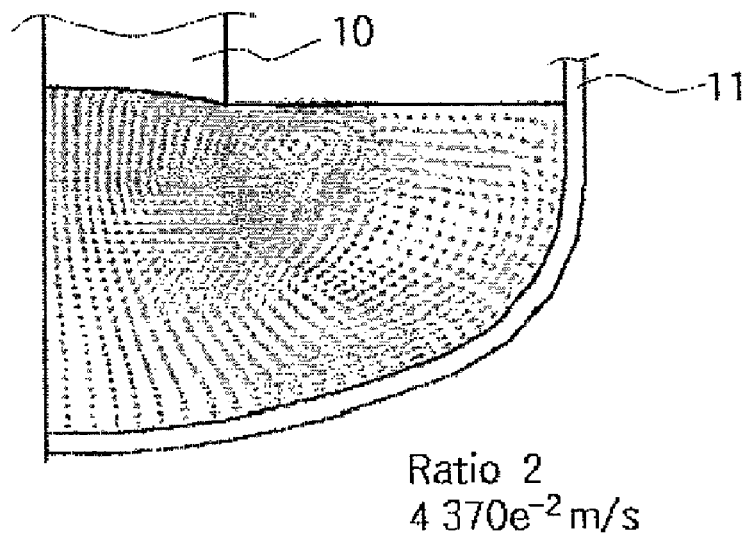
Figure 7D:
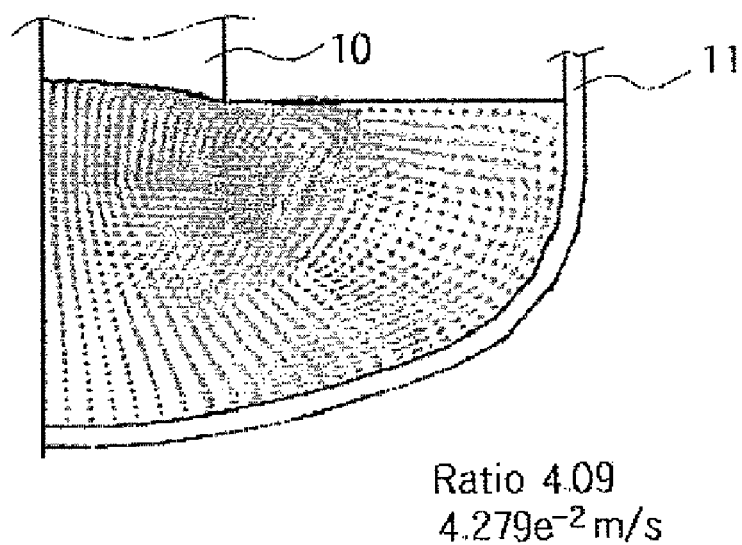
Figure 8A:
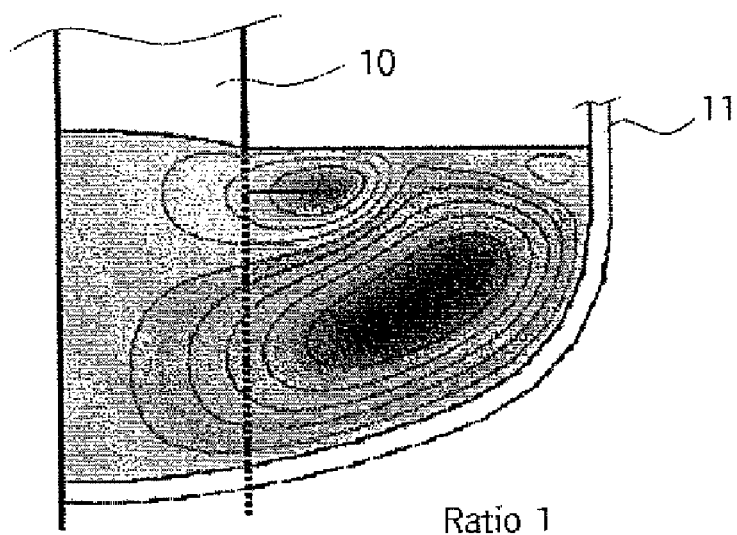
Figure 8B:
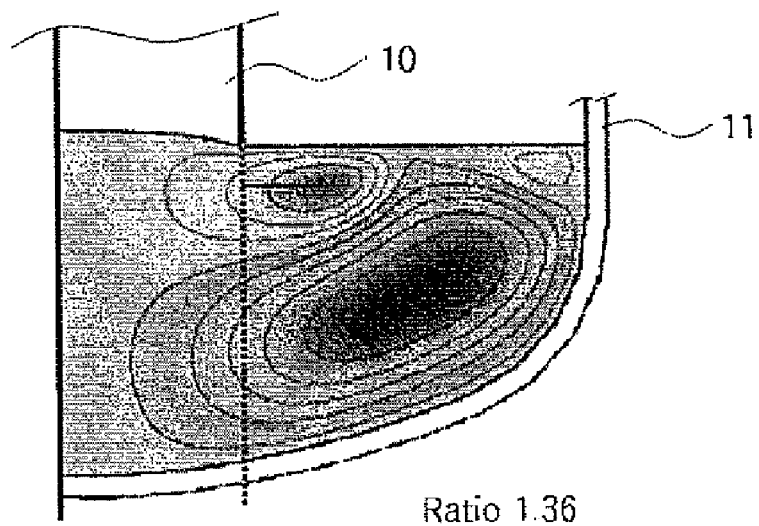
Figure 8C:
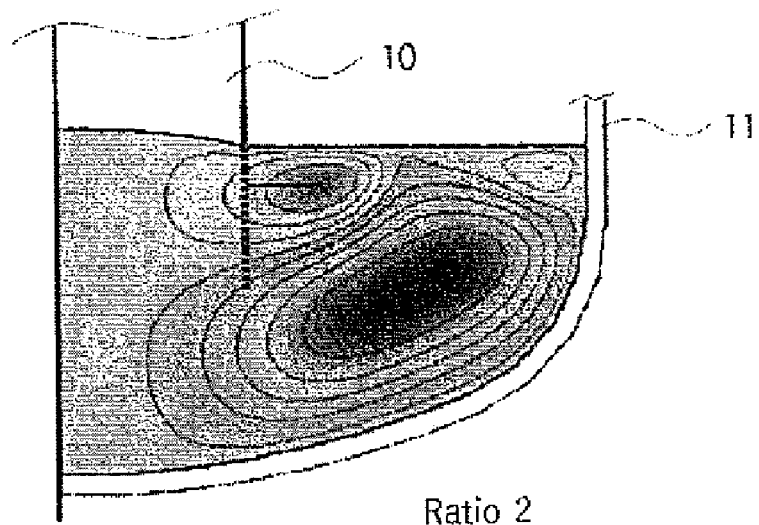
Figure 8D:
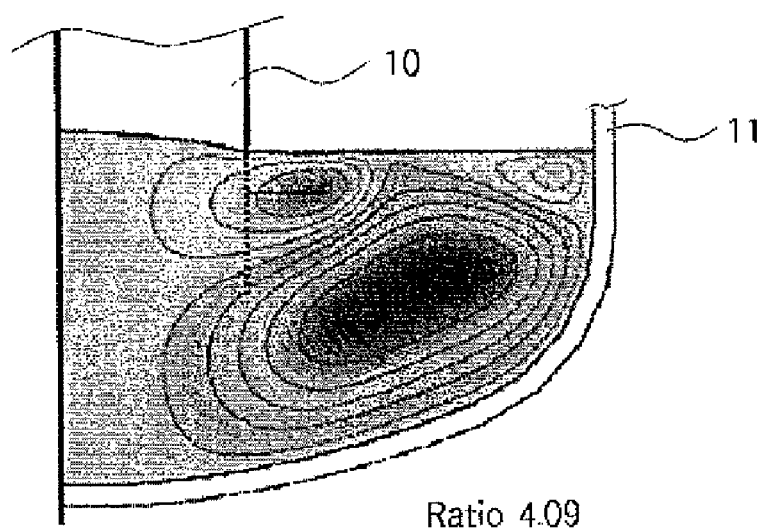

The flower phenomenon was generated in a single crystal ingot grown in the conventional manner as in FIG. 7A, starts being reduced in FIG. 7B, and completely removed after FIG. 7C That is, when the measured intensity of the lower coil member 17 is given as G_lower and the measured intensity of the upper coil member 16 is given as G_upper, the flower phenomenon was controlled if the ratio of the upper/lower magnetic fields satisfies Equation 6 as follows $$1 \leq G\_lower/G\_upper \quad \text{(Equation 6)}$$

It is understood that it is because the Si melt convection speed is decreased from $4.467e^{-2}$m/s to $4.279e^{-2}$m/s according to an increase of the ratio of the magnetic fields, and the Si melt convection is suppressed by a stronger lower magnetic field applied by the lower coil member 17

In addition, FIG. 8A to 8D illustrate a position variance of a center cell of SR when the ratio of the upper/lower magnetic fields are changed and the seed is rotated at the same speed according to an silicon single crystal ingot growing method Referring to FIG. 8A to 8D, it can be known that the cell center of the SR is moved into the silicon ingot 10 as the ratio of the upper/lower magnetic fields is increased from 1.0 to 4.09. It indicates that the increase of the ratio of the upper/lower magnetic fields has an effect on the control of the cell poison of SR.

As described above, what the ratio of the upper/lower magnetic fields is from 1.0 to 4.09 implies that the current can be applied asymmetrically to the upper/lower coil members 16 and 17, and may be realized by the simple control of the input values applied to the upper/lower coil members 16 and 17.

In addition, as shown in Table 1, the greater than 1 (symmetry) the experimental result is, the flower phenomenon is the smaller, that is, the flower phenomenon is suppressed until the ratio becomes 4.09 Looking at the experimental result, the upper limit thereof was not defined because the suppression effect of the flower phenomenon is increased as the ratio is increased as shown in FIG. 7A to 8D

The cells generated by the rotation of the seed and crucible 11 related to the melt convection is suppressed by the asymmetry magnetic field, particularly, the cell extension due to the SR is suppressed by the asymmetry magnetic field thereby controlling the flower phenomenon.

Table 1 indicates an actual flower phenomenon occurrence ratio according to the conventional method and the exemplary embodiment of the present invention In Table 1, 9 indicates a case having a large of flower phenomenon, 3 indicates a case having a small of flower phenomenon, and 1 indicates a case having no flower phenomenon by being completed controlled

TABLE 1

DeletedTexts

| magnetic field ratio | flower phenomenon occurrence number |
|---|---|
| 1 | 9 |
| 1.36 | 3 |
| 1.52 | 1 |
| 2 | 1 |
| 3.02 | 1 |
| 4.09 | 1 |

Resultantly, by changing the current applied to upper/lower coil members 16 and 17 of the silicon single crystal ingot growing apparatus, The quartz crucible elution speed an melt convection may be controlled without adjusting a length of the heater, or adjusting a power by means of the upper/lower insulting member.

When the magnetic fields are asymmetrically applied to the upper/lower coil members 16 and 17 of the silicon single crystal ingot growing apparatus, the SR cell center is placed within 30% to 80% along to a radial direction of the silicon melt surface by adjusting the ratio of the upper/lower magnetic fields, thereby controlling the flower phenomenon.

Preferably, the SR cell center is placed within about 60% along to a radial direction of the silicon melt surface, thereby controlling the flower phenomenon According to an exemplary embodiment of the present invention, the rotation speed of SR is decreased, and simultaneously, the vertical temperature slope G is decreased Thus, a production yield is not decreased due to the quality variance, and the position of the SR center cell can be protected to be forced toward the crucible 11. It means that with respect to the same high-speed SR, the force of the SR cell toward the crucible 11 can be controlled by the asymmetry magnetic field without the deterioration of the SR speed.

As described above, in case that the SR cell center is placed within about 60% along to a radial direction of the silicon melt surface, the lower limit is not defined because there is no flower phenomenon when the SR cell enter into the inside thereof Actually, when the SR cell enters into the inside of the radial direction of the silicon melt surface, the flower phenomenon is not generated even at the SR 1 rpm In addition, by adjusting the ratio of the upper/lower magnetic fields, the center of the SR cell is moved toward the silicon ingot 10 compared to on the occurrence of the flower phenomenon In more detail, the actually driving convection patterns may have a little difference due to a deviation of the respective equipments for example For example, under the same condition, the flower phenomenon may be generated in the one equipment, or may not be generated in the other equipment. At this time, a single crystal ingot growing method according to an exemplary embodiment of the present invention may be applied to the one equipment so as to suppress the flower phenomenon In addition, when the magnetic fields having the ratio of the upper/lower magnetic fields greater than 1 is applied, the asymmetric magnetic fields can suppress the flower phenomenon. That is, the asymmetric magnetic field may be applied such that the position of the SR center cell is placed where the flower phenomenon is suppressed However, the position of the SR center cell may be changed because it is moved by the movement of ZGP (Zero Gauss Plane), that is, the physical movement of the ratio or magnetic members, and accordingly, the convection pattern may be changed. In addition, the flower phenomenon may be generated by various factors as well as the position of the SR center cell However, although the flower phenomenon may be generated by any a factor it can be suppressed by the asymmetric magnetic fields according to an exemplary embodiment of the present invention Accordingly, it is appeared that the flower phenomenon is completely controlled according to the increase of the ratio of the upper/lower magnetic fields FIG. 9 is a graph showing an oxygen concentration along to a radial direction of a wafer manufactured by a silicon single crystal growing method according to an exemplary embodiment of the present invention.

In a wafer produced by silicon single crystal ingot growing method according to an exemplary embodiment of the present invention, an oxygen concentration distribution along to a radial direction thereof may have approximately uniformity of more than at least 92%, and also, an under-diameter due to the flower phenomenon may not substantially occur. Although it may occur, the under-diameter may be allowed within 7 mm along to a radial direction thereof for the growth of the ingot having a diameter of 207 mm In a single crystal ingot growing apparatus and method according to an exemplary embodiment of the present invention, it is obvious that a high quality of silicon single crystal ingot and silicon wafer may be produced As described above, a single crystal ingot growing apparatus and method according to an exemplary embodiment of the present invention have effects as follows.

A single crystal ingot growing apparatus and method according to an exemplary embodiment of the present invention can be applied regardless of such various grade qualities as oxygen concentration, resistivity, point defect distributions of the produced single crystal ingot, and may produce a high-quality of silicon single crystal ingot and silicon wafer because the flower phenomenon is suppressed in entire ranges of goods (ingot, wafer)

In a single crystal ingot growing apparatus and method according to an exemplary embodiment of the present invention, the asymmetric magnetic field have an greater effect on the vertical temperature slope(G) than the SR variance, and the variance of the oxygen concentration along to a longitudinal direction of the silicon ingot 10 can be suppressed.

In a single crystal ingot growing apparatus and method according to an exemplary embodiment of the present invention, the flower phenomenon generated on the growth of the single crystal can be completely suppressed, and such parameter variances as the prime length deterioration due to the under-diameter generated on the occurrence of the flower phenomenon, and P/S down have no effect on a reduction of productivity That is, the SR convection of an interface of the melt can be controlled by process by controlling asymmetric magnetic field so as to control the flower phenomenon, and thus, the under diameter of the single crystal diameter is prevented and the high quality of single crystal ingot having a high productivity can be grown In a single crystal ingot growing apparatus and method according to an exemplary embodiment of the present invention, a large-diameter single crystal greater than 200 mm as well as a middle or small-diameter single crystal may be produced while the flower phenomenon generated on the growth of the single crystal is controlled by the asymmetric magnetic fields without a loss such as the additional hot zone (H/Z) replacement, P/S down, and SR variance.

In addition, regardless of the single crystal length according to the diameter and charging sizes thereof, a uniform diameter is controlled along to a longitudinal direction of the single crystal ingot by applying the asymmetric magnetic fields, and accordingly, a high productivity may be expected.

In a single crystal ingot growing apparatus and method according to an exemplary embodiment of the present invention, a large-diameter single crystal greater than 200 mm as well as a middle or small-diameter single crystal may be produced to have various oxygen concentration qualities according to the client's requirements while the uniform oxygen concentration along to a longitudinal direction is controlled by the asymmetric magnetic fields without a loss such as the additional hot zone (H/Z) replacement, P/S down, and SR variance.

When the position ZGP is placed at a upper of the silicon melt surface and the upper/lower magnetic field is asymmetrically applied in order to control the oxygen concentration of the single crystal, the oxygen concentration can be controlled particularly at the rear portion of the single crystal ingot, and thus, a productivity may be improved and the high quality of the single crystal may be grown.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims

What is claimed is:

1. A silicon single crystal ingot growing method for growing a silicon single crystal ingot based on a Czochralski method, comprising:

asymmetrically applying a magnetic field to an outside of a silicon single crystal ingot growing apparatus using a cusp type magnetic member, the magnetic field includes upper/lower magnetic fields applied by upper/lower coil members disposed at an outside of the silicon single crystal ingot, the upper/lower magnetic fields respectively having an intensity controlled by at least one of a current applied to at least one of the upper/lower coil members and an induction member;

controlling the SR cell center within 30% to 80% along to a radial direction of the silicon melt surface by adjusting the ratio of the upper/lower magnetic fields; and pulling a single crystal ingot from a crystal melt surface.

2. The silicon single crystal ingot growing method of claim 1, wherein a ratio of the upper/lower magnetic fields is changed such that a ZGP(Zero Gauss Plane) formed by the upper/lower magnetic fields is placed at a upper portion of the silicon melt surface.

3. The silicon single crystal ingot growing method of claim 1, wherein the upper/lower magnetic field have different intensity each other, and the intensity of the lower magnetic field is stronger than that of the upper magnetic field.

4. The silicon single crystal ingot growing method of claim 1, wherein a ratio of the upper/lower magnetic fields is changed such that an oxygen concentration along to a longitudinal direction of a single crystal ingot is uniform.

5. The silicon single crystal ingot growing method of claim 1, wherein the intensities of the upper/lower magnetic fields are controlled such that an oxygen concentration along to a longitudinal direction of a single crystal ingot is uniform.

6. The silicon single crystal ingot growing method of claim 1, wherein the asymmetrically applying magnetic fields uses a cusp magnetic field generated by a pair of coil members disposed on a upper/lower outside of the silicon single crystal growing apparatus, on the applying the cusp magnetic field, the ratio of the upper/lower magnetic fields satisfies $1.00 < \text{Exp}(G\_lower/G\_upper) < 135.00$ when the measured intensity of the lower magnetic field is given as $G_{13}$ lower and the measured intensity of the upper magnetic field is given as G_upper.

7. The silicon single crystal ingot growing method of claim 1, wherein the relation between the ZGP and the silicon melt surface satisfies $0 < \text{ZGP\_center} - \text{silicon melt surface} < 500$ cm, assumed that a upper is given as (+) and a lower is given as (−) based on a upper of the heater 14 when a ZGP(Zero Gauss Plane) of the magnetic field applied by the upper/lower coil member and the silicon melt surface correspond with the upper of the heater.

8. The silicon single crystal ingot growing method of claim 1, wherein the ZGP satisfies $Y = C_1 - C_2 X - C_3 X^2$, $C_1 \leqq 500$ and $1 \leqq \text{Exp}(C_3/C_2) \leqq 25$, as well as coefficients $C_2$ and $C_3$ satisfies $1 < \text{Exp}(C_3/C_2) < 25$ along to a radial direction of the silicon single crystal growing apparatus (herein, Y is a position of ZGP, X is a radial-direction position in the crucible, and, $C_1$, $C_2$, and $C_3$ are coefficients when the ratio of the upper/lower magnetic fields is applied).

9. The silicon single crystal ingot growing method of claim 1, wherein a flower phenomenon generated along to a circumferential direction of the silicon single crystal ingot is controlled by changing at least one of the ratio and the intensity of the upper/lower magnetic fields.

10. The silicon single crystal ingot growing method of claim 1, wherein the SR cell center is controlled within about 60% along to a radial direction of the silicon melt surface.

11. The silicon single crystal ingot growing method of claim 1, wherein the position of the SR cell center is controlled by a current applied to the upper/lower coil members.

12. The silicon single crystal ingot growing method of claim 10, wherein the position of the SR cell center is controlled by at least one of magnetic induction members displaced within the upper/lower coil members.

13. The silicon single crystal ingot growing method of claim 1, wherein a silicon melt convection speed is decreased when the ratio of the upper/lower magnetic fields is increased.

* * * * *